US010326072B2

(12) United States Patent
Toda (10) Patent No.: US 10,326,072 B2
(45) Date of Patent: Jun. 18, 2019

(54) IMPEDANCE MATCHING LAYER FOR ULTRASONIC TRANSDUCERS WITH METALLIC PROTECTION STRUCTURE

(71) Applicant: Measurement Specialties, Inc., Hampton, VA (US)

(72) Inventor: Minoru Toda, Lawrenceville, NJ (US)

(73) Assignee: MEASUREMENT SPECIALTIES, INC., Hampton, VA (US)

( * ) Notice: Subject to any disclaimer, the term of this patent is extended or adjusted under 35 U.S.C. 154(b) by 456 days.

(21) Appl. No.: 15/152,226

(22) Filed: May 11, 2016

(65) Prior Publication Data

US 2016/0332198 A1 Nov. 17, 2016

Related U.S. Application Data

(60) Provisional application No. 62/159,559, filed on May 11, 2015.

(51) Int. Cl.
| | |
|---|---|
| *H01L 41/04* | (2006.01) |
| *H01L 41/16* | (2006.01) |
| *H01L 41/22* | (2013.01) |
| *B06B 1/06* | (2006.01) |
| *G10K 9/122* | (2006.01) |
| *G10K 11/00* | (2006.01) |

(52) U.S. Cl.
CPC .............. *H01L 41/22* (2013.01); *B06B 1/067* (2013.01); *G10K 9/122* (2013.01); *G10K 11/002* (2013.01)

(58) Field of Classification Search
CPC ......... H01L 41/22; B06B 1/067; G10K 9/122; G10K 11/002

USPC .......................................................... 310/334
See application file for complete search history.

(56) References Cited

U.S. PATENT DOCUMENTS

| 4,166,967 A | * | 9/1979 | Benes | A61B 8/546 |
| | | | | 310/322 |
| 4,211,948 A | | 7/1980 | Smith et al. | |
| 4,383,194 A | | 5/1983 | Ohigashi et al. | |
| 4,446,395 A | * | 5/1984 | Hadjicostis | G10K 11/002 |
| | | | | 310/327 |
| 4,507,582 A | | 3/1985 | Glenn | |

(Continued)

FOREIGN PATENT DOCUMENTS

| JP | 06308104 A | 11/1994 |
| JP | H10507600 A | 7/1998 |

(Continued)

OTHER PUBLICATIONS

International Search Report and Written Opinion of the International Searching Authority, issued in related PCT/US2016/031931, dated Oct. 13, 2016.

(Continued)

*Primary Examiner* — Thomas M Dougherty
(74) *Attorney, Agent, or Firm* — Howard IP Law Group (57) ABSTRACT

An ultrasonic transducer comprising a piezoelectric element, an acoustic matching layer arranged on a surface of the piezoelectric element and having a thickness of at least one-quarter of a wavelength of a center resonant frequency of the transducer, and a front metal layer arranged on a surface of the acoustic matching layer opposite that of the piezoelectric element and having a thickness equal to one-half of the wavelength of the center resonant frequency.

20 Claims, 4 Drawing Sheets

(56) References Cited

U.S. PATENT DOCUMENTS

| | | |
|---|---|---|
| 4,603,276 A | 7/1986 | Coursant |
| 4,672,591 A | 6/1987 | Breimesser et al. |
| 4,712,037 A | 12/1987 | Verbeek et al. |
| 4,771,205 A | 9/1988 | Mequio |
| 4,881,212 A | 11/1989 | Takeuchi |
| 4,976,150 A | 12/1990 | Deka |
| 5,511,550 A | 4/1996 | Finsterwald |
| 6,160,340 A | 12/2000 | Guo et al. |
| 6,307,302 B1 | 10/2001 | Toda |
| 6,548,942 B1 | 4/2003 | Panasik |
| 6,772,490 B2 | 8/2004 | Toda |
| 6,989,625 B2 | 1/2006 | Suzuki et al. |
| 7,956,514 B2 | 6/2011 | Oakley et al. |
| 9,050,628 B2* | 6/2015 | Lautzenhiser ........ E21B 47/101 |
| 2002/0027400 A1 | 3/2002 | Toda |
| 2004/0124746 A1 | 7/2004 | Suzuki et al. |
| 2004/0174095 A1 | 9/2004 | Bhardwaj |
| 2005/0001517 A1 | 1/2005 | Yogeswaren |
| 2005/0046311 A1 | 3/2005 | Baumgartner et al. |
| 2005/0061084 A1 | 3/2005 | Brun |
| 2005/0099097 A1 | 5/2005 | Baumgartner et al. |
| 2005/0127793 A1 | 6/2005 | Baumgartner et al. |
| 2005/0194865 A1 | 9/2005 | Angelsen et al. |
| 2005/0225211 A1 | 10/2005 | Oliver |
| 2005/0236930 A1* | 10/2005 | Hasegawa ............... B06B 1/067 310/322 |
| 2007/0200460 A1 | 8/2007 | Scott |
| 2007/0222339 A1 | 9/2007 | Lukacs et al. |
| 2008/0007142 A1 | 1/2008 | Toda |
| 2009/0034370 A1 | 2/2009 | Guo |
| 2009/0062655 A1* | 3/2009 | Saito ..................... G10K 11/02 600/459 |
| 2009/0072668 A1 | 3/2009 | Gelly et al. |
| 2009/0147627 A1 | 6/2009 | Toda et al. |
| 2010/0066207 A1 | 3/2010 | Saito |
| 2010/0249670 A1 | 9/2010 | Smith et al. |
| 2010/0283355 A1 | 11/2010 | Shieh et al. |
| 2011/0050039 A1* | 3/2011 | Toda .................... B06B 1/0622 310/327 |
| 2011/0314933 A1* | 12/2011 | Mueller ............... B06B 1/0655 73/861.18 |
| 2014/0292941 A1 | 10/2014 | Kobayashi et al. |
| 2016/0296975 A1* | 10/2016 | Lukacs .................... A61B 8/12 |

FOREIGN PATENT DOCUMENTS

| | | | |
|---|---|---|---|
| JP | 2008-85413 A | * 4/2008 | ............. H04R 17/00 |
| WO | 200805611 A1 | 5/2008 | |

OTHER PUBLICATIONS

Toda, Minoru, "New type of matching layer for air-coupled ultrasonic transducers," Ultrasonics, Ferroelectrics and Frequency Control, IEEE Transactions on, vol. 49, No. 7, pp. 972,979, Jul. 2002.

International Search Report dated Oct. 26, 2010 for related application No. PCT/US2010/046035.

Kosinski, J. et al., "PZT-Based Stacked Acoustic Filters," US Army Electronics Technology and Devices Laboratory, Proceeding of 8th IEEE International Symposium of Application of Ferroelectrics, pp. 281-284.

Willatzen, Morten, "Ultrasound Transducer Modeling—Received Voltage Signals and the Use of Half-Wavelength Window Layers with Acoustic Coupling Layers," IEEE Ultrasonics, Ferroelectrics and Frequency Control, vol. 46, No. 5, Sep. 1999, pp. 1164-1174.

Supplementary Partial European Search Report, issued in related European Patent Application No. EP 16793476; dated Nov. 8, 2018.

* cited by examiner

IMPEDANCE MATCHING LAYER FOR ULTRASONIC TRANSDUCERS WITH METALLIC PROTECTION STRUCTURE

CROSS-REFERENCE TO RELATED APPLICATION

This application claims the benefit of priority under 35 U.S.C. § 119(e) to U.S. Provisional Application Ser. No. 62/159,559 filed May 11, 2015, which is incorporated by reference herein in its entirety for all purposes.

FIELD OF THE INVENTION

The present invention relates generally to ultrasonic sensors, and more specifically, to systems and methods for providing protection and acoustic impedance matching in an ultrasonic transducer.

BACKGROUND

Ultrasonic transducers, particularly those used in industrial applications, typically have to meet certain minimum safety requirements and standards. Such requirements include protection from flying particles and inadvertent or accidental impacts, resistance to corrosion from liquids to be contacted, chemical inertness so as not to contaminate the liquid to be measured, a wide range of tolerance to static or dynamic pressure variations, and/or a wide range of operational or storage temperatures.

Current solutions for protecting ultrasonic transducers include the addition of a protective layer, such as a metallic protective layer, attached generally to the front of a piezoelectric element of the transducer. In these structures, acoustic wave reflections arise at two locations. A first reflection occurs generally at a boundary between the protection layer and a bonding layer. A second reflection also occurs at a boundary between the protection layer and radiation medium. The two distinct locations of these reflections result in a sharp resonant peak, reduced sensitivity and ringing of the received signal.

Moreover, ultrasonic transducers often utilize various forms of acoustic impedance matching solutions or acoustic impedance converters. These may include single or multiple layer structures of polymer and/or metal materials. In particular, acoustic impedance converters may utilize one or more one-quarter ($\frac{1}{4}$, or "quarter") wavelength thick layers for providing a desired acoustic impedance conversion. Moreover, acoustic impedance converters may utilize relatively thin metal and polymer layers on the order of, for example, one-thirty seventh ($\frac{1}{37}$) and one-sixteenth ($\frac{1}{16}$) of a wavelength in thickness, respectively, for achieving acoustic impedance conversion. These converters lack suitability as protective structures due to the minimal thickness of their metal layers. Moreover, as their metal and polymer layers are configured (e.g. sized) to function cohesively as an impedance converter having targeted characteristics, altering the thickness of the metallic layers for improving protection would lead to degraded intended performance.

Improved structures offering suitable protection, chemical inertness and resistance to thermal degradation and/or fatigue, as well as improved sensitivity and wideband operation of the transducer are desired.

SUMMARY

In one embodiment of the present disclosure, an ultrasonic transducer is provided. The transducer includes a piezoelectric element, an acoustic matching layer and a front metal or protective layer. The acoustic matching layer is arranged on a surface of the piezoelectric element and has a thickness of at least one-quarter of a wavelength of a center resonant frequency of the transducer. The front metal layer is arranged on a surface of the acoustic matching layer opposite that of the piezoelectric element and has a thickness approximately equal to one-half ($\frac{1}{2}$, or "half") of the wavelength of the center resonant frequency.

An ultrasonic transducer according to another embodiment of the present disclosure includes a piezoelectric element, an acoustic matching layer formed on a surface of the piezoelectric element, and a front protective structure. The acoustic matching layer comprises a thickness of at least one-quarter of a wavelength of a predetermined center resonant frequency of the transducer. The front protective structure is formed on a surface of the acoustic matching layer opposite that of the piezoelectric element and includes a first metal layer, a second metal layer, and a polymer layer arranged between the first and second metal layers.

A further embodiment of the present disclosure includes a method of forming an ultrasonic transducer. The method includes the steps of providing a piezoelectric element, a matching layer and a metal or protective layer. The matching layer is coupled to the piezoelectric element and has a thickness of at least one-quarter of a wavelength of a predetermined center resonant frequency of the transducer. The metal layer is arranged on a surface of the acoustic matching layer opposite that of the piezoelectric element, and has a thickness equal to one-half of the wavelength of the predetermined center resonant frequency.

DETAILED DESCRIPTION OF PREFERRED EMBODIMENTS

It is to be understood that the figures and descriptions of this disclosure have been simplified to illustrate elements that are relevant for a clear understanding of the disclosed subject matter, while eliminating, for purposes of clarity, many other elements found in typical ultrasonic transducer-based measuring systems. However, because such elements may be well-known in the art, or because they do not facilitate a better understanding of the subject matter, a discussion of such elements is not provided herein. The disclosure herein is directed to all such variations and modifications known to those skilled in the art.

In the following detailed description, reference is made to the accompanying drawings that show, by way of illustration, embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not be taken in a limiting sense, and the scope of invention is defined only in the appended claims, appropriately interpreted, along with the full range of equivalents to which the claims are entitled. In the drawings, like numerals refer to the same or similar functionality through several views.

In general, when a protective layer (e.g. a metal layer) is arranged at the front of a transducer's piezoelectric element and the protective layer has direct contact to the radiation medium (e.g. for reasons of chemical inertness and cleanliness), the impedance of the protective layer is significantly higher than that of the transducer or piezoelectric layer. In order to maximize performance of the transducers utilizing a protective layer, improved design principles for creating suitable matching layers are needed. For example, one-half wavelength protective layers (i.e. metallic layers) may be utilized for achieving maximum acoustic wave propagation and resonance, as one-half wavelength thick layers do not convert impedance. These one-half wavelength thick metallic layers may be bonded directly to the piezoelectric body, or may be bonded thereto by a thin coupling gel or epoxy. When the thickness of this bonding layer is very thin, coupling efficiency becomes high, as does the sensitivity, thereby increasing the performance of the transducer.

However, thin bonding layers often experience thermal problems. For example, the thermal expansion coefficient(s) of stainless steel are about one order greater than that of a typical piezoelectric ceramic (PZT) material. Therefore, degradation of the sensor properties may occur due to internal strain, fatigue or delamination, while being operated or stored in an environment open to a wide temperature variation/range. Accordingly, bonding materials utilized between the transducer layer and a protective layer should be sufficiently thick so as to absorb any thermal expansion difference, however, they also need to be sized to maximize transducer performance.

An embodiment of the present disclosure relates to a highly-sensitive, wideband ultrasonic transducer utilizing a one-half wavelength thick protective metal layer mounted at the front end of a piezoelectric element. In another embodiment, a metal-polymer-metal structure may be implemented as an alternative to a one-half wavelength metal layer and may be featured by significantly broader bandwidth. A matching or coupling layer is provided between the protective layer (or protective structure) and the piezoelectric element. The matching layer is preferably embodied as an electrically conductive epoxy material configured to increase signal bandwidth as well as provide a means to form a connection to ground.

In operation, vibrations in the piezoelectric material of an ultrasonic transducer are transmitted through the matching or coupling layer and the protective layer, exciting an acoustic wave in an associated propagation medium (typically liquid) from the surface of the protective layer. The transmitted acoustic wave may be reflected by an object and subsequently received by the same transducer. Conventional circuitry for processing the received signal may also be provided. In another mode of operation, the excited acoustic wave is received by another discrete transducer having a similar structure and having circuitry for processing the received signal. In any event, based on the received signal and/or the determined propagation time of the signal, certain physical properties of the medium (e.g. liquid) may be measured and analyzed. In addition, based on the received signal and/or the determined propagation time of the signal, certain physical properties including the distance of an object from a given transducer or other structure may be measured and analyzed.

The transmission efficiency of an acoustic wave through a metal layer is generally very low when the metal layer is arranged between other dissimilar materials (e.g. polymer or water) as a result of the strong reflections at the material boundaries. For a metal layer contacting the radiation medium at an outer side, when the thickness of the metal layer is equal to one-half wavelength, the mechanical impedance of the metal layer seen from the transducer side becomes equal or substantially equal to that of the outside material (e.g. water or other liquid). The terms equal or substantially equal may be understood in the context of an idealized condition of a metal without loss, but actually a very small loss in the metal may make for a slight difference; however, such difference is negligible for determining mechanical impedance. Thus, a metal layer contacting the radiation medium at an outer side, when the thickness of the metal layer is equal or substantially equal to one-half wavelength, the mechanical impedance of the metal layer seen from the transducer side becomes equal or substantially equal to that of the outside material (e.g. water or other liquid).

In order to improve the transmission efficiency and to increase transducer bandwidth, a matching layer is inserted between the transducer material and the one-half wavelength thick protective metal layer. In an embodiment, the design of the matching layer includes: (1) thickness between one-quarter of a wavelength and four-tenths times the wavelength; in other words (1–1.7)×¼ of wavelength; (2) impedance between that of the transducer material and radiation material; (3) the material is an epoxy-based or like material such as an epoxy or powder loaded epoxy or conductive epoxy; (4) conductive epoxy or like material is used as an electrical connection between the transducer electrode and reference (ground) potential; (5) elastically soft conductive epoxy or like material designed as matching layer is provided with appropriate thickness which absorbs thermal expansion difference between the protection metal layer and transducer layer (e.g. piezoelectric ceramic material layer). To further improve bandwidth, the one-half wavelength metal protective layer may be replaced by a metal-polymer-metal structure, example of which is composed of stainless steel-polyimide-stainless steel layers each having a thickness of approximately ¹⁄₁₇ of the wavelength, and a polyimide layer having a thickness of approximately ¹⁄₂₀ of the wavelength. The matching layer is inserted between the transducer or piezoelectric element layer and protective layer to provide bandwidth several times broader than the design of a one-half wavelength protective metal layer.

Figure 1:
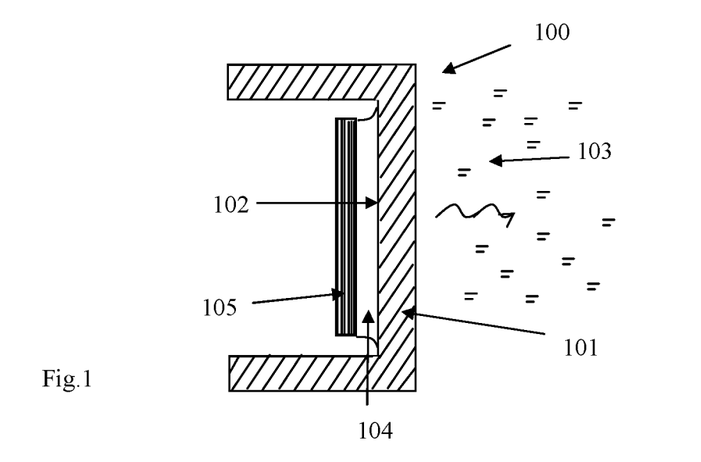
FIG. 1 shows a cross sectional view of a transducer having a front protective layer coupled thereto through a matching layer according to an embodiment of the present disclosure.

Reference will now be made in detail to the present exemplary embodiments of the disclosure, examples of which are illustrated in the accompanying drawings. FIG. 1 shows the structure of an ultrasonic transducer 100 having a front protective metal layer 101. In one embodiment, protective layer 101 is designed to be one-half wavelength thick (e.g. 900 micrometer (μm) for preferably a stainless steel material at 3.2 megahertz (MHz)-3.3 MHz, wherein the thickness of stainless steel is thus inversely proportional to the designed resonant frequency of the transducer, and the designed frequency is determined by the condition of the thickness being equal to one-half of wavelength in the piezoelectric material. The mechanical impedance of protective layer 101 seen from a transducer side 102 towards a liquid 103 is equal to that of the outside medium (i.e. liquid 103), at the one-half wavelength condition. An impedance matching or coupling layer 104 may be configured in a manner similar to that suitable for a transducer structure without a metal protective layer. For example, an acoustic impedance $Z_m$ of matching layer 104 may comprise a value between an acoustic impedance $Z_P$ of a transducer material (e.g. a piezoelectric material) 105 and an acoustic impedance $Z_L$ for liquid 103. The thickness of matching layer 104 is approximately one-quarter wavelength or thicker in value, and is positioned between and bonded to, protective layer 101 and transducer material 105. Matching layer 104 preferably comprises a conductive epoxy or metal powder loaded polymer, such that it may be utilized as a connection between an electrode of the transducer and a reference potential (e.g. ground). However, it is possible to use a non-conductive matching layer with a polymer base material and provide a connection from an electrode of the piezoelectric layer to ground via one or more wires.

Transducer 100 may be configured to be operated over a wide temperature range with a storage temperature also covering a wide range. As the thermal expansion of stainless steel (or other typical metals) is 15-17×10$^{-6}$/deg. C. and piezoelectric ceramic has approximately ⅒ of this magnitude, matching layer 104 should be sufficiently thick so as to absorb resulting thermal expansion differences. If matching layer 104 is designed to be thin in order to obtain a relatively high sensitivity coming from a one-half wavelength design of a metal protective layer, internal strain at extreme temperatures would lead to a degradation of performance, due at least in part to the change of material performance, such as fatigue, delamination, internal cracking, and the like. Therefore, matching layer 104 should relatively soft or deformable, but not too thin.

Figure 2:
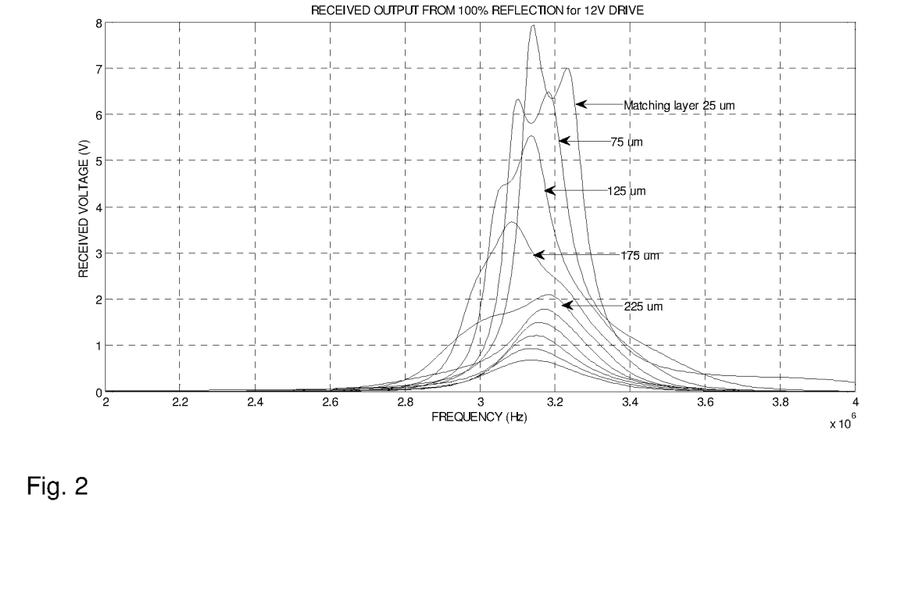
FIG. 2 shows simulation results of a front protective layer comprising a one-half wavelength thick stainless steel layer and a plurality of matching layers of varying thickness.

FIG. 2 shows a simulation result using a Mason model and describes details of the influence of the thickness of a matching layer of conductive epoxy. The exemplary protection layer comprises 900 μm thick stainless steel which is at one-half wavelength condition at a 3.2-3.3 MHz transducer operating frequency. The ordinate represents received voltage, which is a reflection signal from a target in water wherein the same transducer for transmit and receive modes is assumed. As illustrated, the received signal becomes a maximum at 3.2 MHz. When the thickness of the matching layer (e.g. conductive epoxy) is relatively thin (e.g. 25 μm-75 μm), bandwidth is narrower (Δf=0.2 MHz, −6 dB points). When the matching layer becomes thicker (e.g. to one-quarter (0.25) of the wavelength to 0.4 of the wavelength (140 μm-225 μm)), bandwidth becomes broader (Δf=0.3-0.5 MHz). Further thickening of the matching layer (e.g. one-half wavelength (280 μm)) makes for a narrower bandwidth and lower sensitivity. Therefore, the simulation illustrates that a matching layer according to embodiments of the present disclosure should be configured to have a thickness of approximately 0.25-0.4 of the wavelength.

Figure 3:
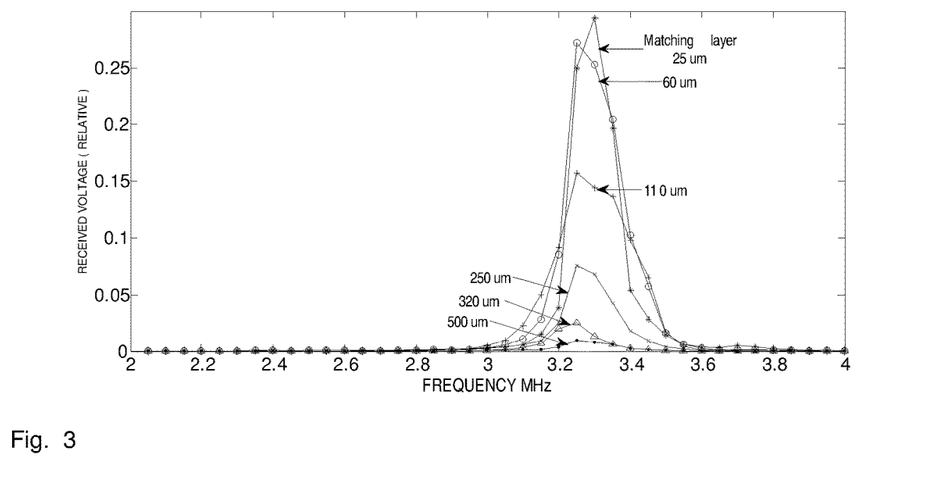
FIG. 3 shows experimental results of a received signal from ten centimeter (cm) deep target in water for a transducer having a protection layer of one-half wavelength thick stainless steel and a conductive epoxy defining a matching layer according to an embodiment of the present disclosure.

FIG. 3 shows an experimental observation of the effect of a matching layer which broadens transducer bandwidth. As shown, when the matching layer is thin (e.g. 25 um), observed bandwidth is 0.13 MHz. As thickness is increased to 110 μm, bandwidth becomes 0.27 MHz. Further thickening of the matching layer (e.g. greater than 250 μm) results in the bandwidth narrowing again, with the received signal becoming weaker. The exemplary transducer structure was tested for 40 thermal cycling of 23-155 deg. C. range. The results illustrate almost no difference in performance after the thermal cycling.

Figure 4A:
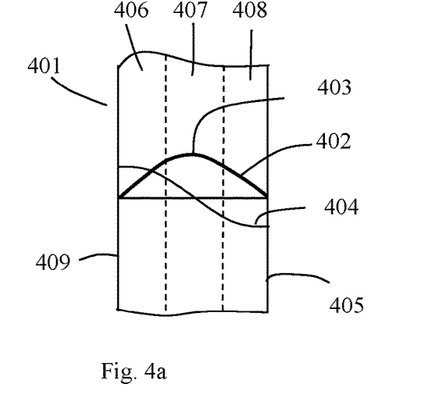
FIG. 4a shows distribution of stress and displacement in a one-half wavelength thick protective material layer when an acoustic wave propagates therethrough.

Resulting distributions of stress and displacement in a one-half wavelength protective layer 401 (e.g. a metal layer) are shown in FIG. 4a. When an acoustic wave propagates through the one-half wavelength layer 401, a strong resonance having a sharp peak is excited at the one-half wavelength condition. At this resonance condition, a stress distribution 403 has its maximum at the center of layer 401, and displacement 404 is distributed with zero at the center and the direction is opposite at the left and right side (when a surface 409 of layer 401 moves to the left, a surface 406 of layer 401 moves to the right). For purposes of illustration, by segmenting or dividing the wavelength layer into three hypothetical regions 406, 407, 408, central region 407 is virtually vibration-free, however, regions 406 and 408 vibrate with opposite direction.

Figure 4B:
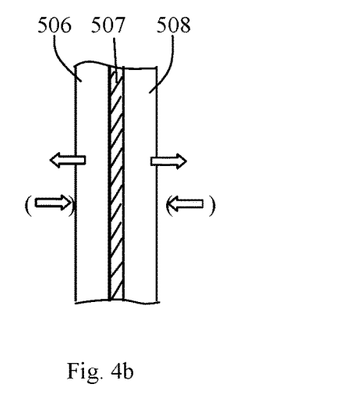
FIG. 4b shows a protective layer comprising a metal-polymer-metal structure with stress and displacement similar to that of a one-half wavelength metal layer according to another embodiment of the present disclosure.
Figure 5:
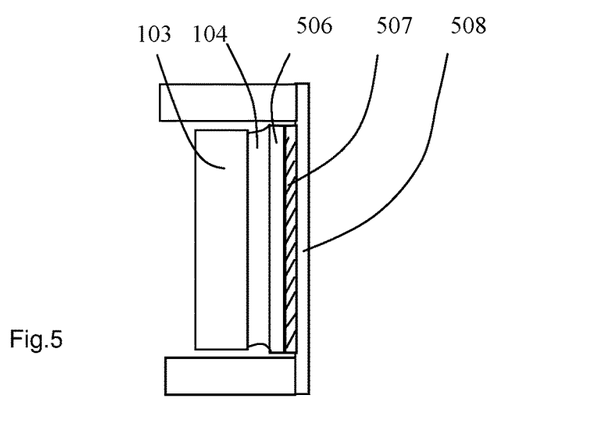
FIG. 5 shows an ultrasonic transducer structure utilizing the protective layer of FIG. 4b.

Referring generally to FIGS. 4b and 5, in another embodiment of the present disclosure, the above-described one-half wavelength metal protective layer may be replaced by a multilayer structure comprising a metal-polymer-metal structure. As shown, three layers including metal layer 506, polymer layer 507, and metal layer 508 are bound together (e.g. via pressure or adhesive, epoxy bonding layers) to form a single structure. The basic principle of this multilayer structure is equivalent to two outer masses bound by a central spring. This is a resonant system with both masses vibrating out of phase, wherein the spring expands or shrinks during vibration. In operation, metal layers (mass) 506 and 508 move in opposite directions, stressing central polymer layer (spring) 507. This system behaves similar to that of the one-half wavelength metal layer shown in FIG. 4a with regard to the stress and displacement. Since the polymer material has a much lower elasticity constant (i.e. softer) than metal, polymer layer 507 has to comprise a relatively thin layer in order to obtain the same or similar resonance frequency. Specifically, the metal-polymer-metal three-layer design described herein is configured to be significantly thinner than the above-described 900 μm metal only layer, for a given frequency. As a result, the resonance bandwidth of the device is broadened, as the large elastic loss in the polymer layer and resonance bandwidth of the system is determined by the elastic loss in the polymer layer.

By way of example only, upon calculation of an exemplary embodiment, the outer stainless steel layers (shown in the embodiment as the same metal of uniform thickness) should be approximately 0.057 of the wavelength (i.e. 100 μm) for a 3.3 MHz design), and the internal polyimide layer comprises a thickness of 0.053 of the wavelength (i.e. 35 μm at 3.3 MHz or 25 μm polyimide and 5 μm epoxy at both sides for bonding). Thus, a single layer design of 900 μm thick metal layer stainless steel at 3.2 MHz-3.3 MHz may be replaced with a thinner structure of only 235 μm total thickness layer (i.e. a 35 µm polyimide layer sandwiched between two 100 µm thick stainless steel layers). At lower operating frequencies (e.g. at 1.0 MHz), the thicknesses of the layers should be designed to be thicker. For example, in such an exemplary embodiment, the outer layers of stainless steel comprise a thickness of 330 µm and the internal polyimide layer comprises a thickness of 115 µm (or 105 µm polyimide and 5 um epoxy at both sides). For other frequencies, the thickness can be designed with a relation of inverse proportionality. FIG. 5 shows an exemplary structure of an ultrasonic transducer utilizing the protective structure of FIG. 4b, including metal layers 506,508 and polymer layer 507 arranged therebetween. This structure is arranged on transducer layer (piezoelectric ceramic) 103 via matching layer 104. The above illustrates design examples wherein the same materials and same thicknesses are used for the two metal regions. However, different metals of similar characteristics may also be used for the two metal regions. Further, depending on the design, the relative thicknesses of the two metal layers need not be the same. It is possible to use an inner layer of a metal such as copper, brass, iron, nickel, or metals more easily chemically eroded that can be acceptable because of the position of the internal layer. Moreover, while the densities of these metal materials are not significantly different from stainless steel, the thickness of the material can be slightly adjusted for achieving optimal conditions. Note that some metals are not of similar characteristics (i.e. dissimilar metals, relative to stainless steel) such as aluminum, titanium, tungsten, cadmium, indium, and the like, due to their low density. Thus, adjustment of their relative thickness may be possible but has no meaning or use in embodiments of the invention. However, metals having characteristics similar to that of stainless steel (e.g. brass, copper, iron, aluminum, nickel, gold, alloys thereof, etc.) may be used as internal layer with similar thickness. More exact material selection guidelines when materials other than stainless steel and polyimide are used include adjusting the thickness of the metal inversely to its density (i.e. lighter metals should be thicker to achieve the same weight), and adjusting the thickness of polymer to be proportional to its elastic stiffness (i.e. softer materials should generally be made thinner to achieve the same spring effect).

In analogous fashion, materials sufficiently similar to the polymer layer 507 shown in FIG. 4b may be utilized such as epoxy, PVDF, nylon, stretched polyester, polystyrene films, and so on. In contrast, dissimilar materials dissimilar to polymer layer 507 include but are not limited to rubber or latex, polyacetate, polyurethane, and the like, may not be utilized.

Figure 6:
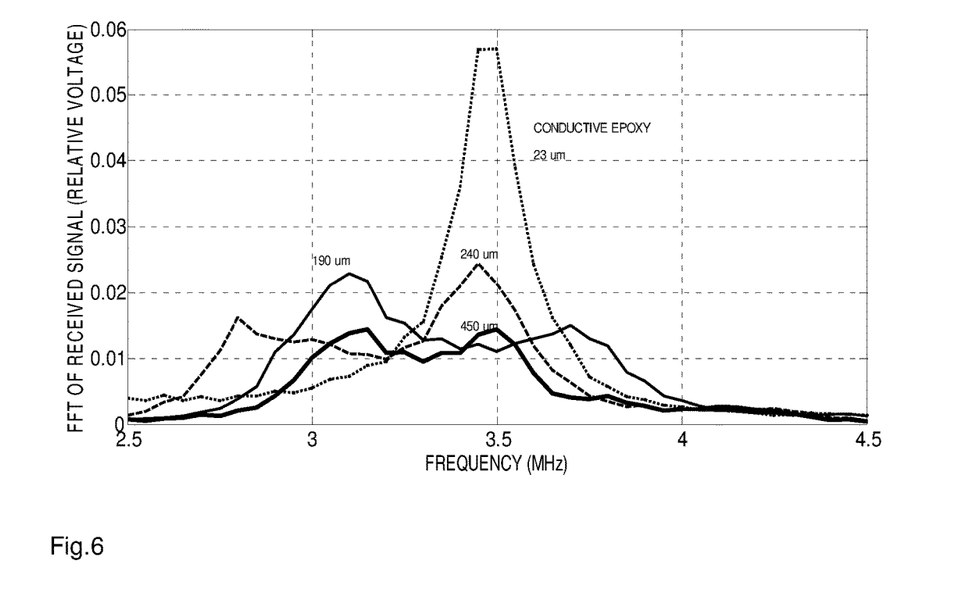
FIG. 6 shows experimental results of a received signal from a ten cm deep target in water for a transducer comprising a metal-polymer-metal protective layer and an epoxy matching layer according to embodiments of the present disclosure.

FIG. 6 illustrates experimental results of a 100 µm stainless steel layer, a 25 µm polyimide layer (5 µm epoxy bonding at both surfaces), and a 100 µm stainless steel layer used as a protective structure with various thicknesses of a conductive epoxy used as a matching layer. The matching layer material used in the experiments for FIG. 3 and FIG. 5 comprised a conductive epoxy with low elastic constant. Due to its electrical conductivity, the matching layer is advantageously used as connection to ground electrode of the transducer of FIG. 3 and FIG. 5.

Thus, there is disclosed herein a system, device and method of transducer structure and functions wherein an impedance matching layer is inserted between a metallic protective layer and a transducer layer. The thickness of the matching layer is in the range of 0.25-0.4 of the wavelength in the material. The acoustic impedance of the matching layer is between those of the radiation medium and transducer material. In addition:

(1) In embodiments of the disclosure, the protection layer should be a one-half wavelength thick metal layer.
(2) In embodiments of the disclosure, the material of the matching layer may be chosen from epoxy, conductive epoxy, polymer-powder mixture, or other similar materials.
(3) In embodiments of the disclosure, an alternative structure of the protective layer is metal-polymer-metal with a reduced thickness relative to the one-half wavelength thick metal layer described herein above. In one embodiment of this three-layer structure, each stainless steel layer has a thickness of 0.057 of the wavelength and polyimide layer has a thickness of 0.053 of the wavelength; and wherein the matching layer is inserted between the transducer material and the protective layer. It is to be understood that the expression of fractional wavelength can be used for different frequencies of similar materials, but not used for dissimilar materials. This matching layer's thickness is 0.25-0.4 of the wavelength to obtain wideband performance, and the acoustic impedance is between those of the transducer material and radiation medium.
(4) The matching layer may be used as connection between reference (ground) potential and a transducer's electrode with the protection layer connected to reference (ground) potential.
(5) The matching layer material is relatively soft and pliable. Such flexible materials as epoxy or conductive epoxy, metal powder polymer mixture may be utilized to absorb the difference of thermal expansion between the transducer material and the protection metal to avoid degradation of performance (due to delamination or fatigue of the material of matching layer) at a high temperature (e.g. about 80 degrees C. and above).

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

The invention claimed is:

1. An ultrasonic transducer comprising:
   a piezoelectric element;
   an acoustic matching layer arranged on a surface of the piezoelectric element and having a thickness of at least one-quarter of a wavelength of a center resonant frequency of the transducer; and
   a front metal layer arranged on a surface of the acoustic matching layer opposite that of the piezoelectric element and having a thickness equal to one-half of the wavelength of the center resonant frequency.

2. The ultrasonic transducer of claim 1, wherein the thickness of the acoustic matching layer is between one-quarter and one-half of the wavelength of the center resonant frequency.

3. The ultrasonic transducer of claim 1, wherein the front metal layer comprises stainless steel.

4. The ultrasonic transducer of claim 3, wherein the acoustic matching layer comprises a polymer material.

5. The ultrasonic transducer of claim 1, wherein the acoustic matching layer comprises a conductive epoxy electrically connected to reference potential.

6. The ultrasonic transducer of claim 1, wherein the acoustic matching layer comprises a conductive epoxy, and wherein the center resonant frequency of the transducer is approximately 3.2-3.3 MHz, wherein the thickness of the front metal layer is approximately 900 μm, and wherein the thickness of the acoustic matching layer is between 140 μm and 225 μm.

7. The ultrasonic transducer of claim 1, wherein the acoustic impedance of the acoustic matching layer is between that of a radiation medium and that of the piezoelectric element.

8. The ultrasonic transducer of claim 1, wherein the acoustic matching layer comprises a metal powder loaded polymer material.

9. The ultrasonic transducer of claim 1, wherein the front metal layer at least partially surrounds of the piezoelectric element and the acoustic matching layer.

10. The ultrasonic transducer of claim 9, wherein the front metal layer forms at least a portion of a housing containing the piezoelectric element and the acoustic matching layer.

11. A method of forming an ultrasonic transducer comprising the steps of:
    providing a piezoelectric element;
    providing a matching layer coupled to the piezoelectric element, the matching layer having a thickness of at least one-quarter of a wavelength of a predetermined center resonant frequency of the transducer; and
    providing a metal layer on a surface of the matching layer opposite that of the piezoelectric element, the metal layer having a thickness equal to one-half of the wavelength of the predetermined center resonant frequency.

12. The method of claim 11, wherein the thickness of the matching layer is between one-quarter and one-half of the wavelength of the predetermined center resonant frequency.

13. The method of claim 11, wherein the first and second metal layers comprise stainless steel.

14. The method of claim 11, wherein the metal layer forms at least a portion of a housing containing the piezoelectric element and the matching layer.

15. An ultrasonic transducer comprising:
    a piezoelectric element;
    an acoustic matching layer formed on a surface of the piezoelectric element and having a thickness between one-quarter and one-half of a wavelength of a predetermined center resonant frequency of the transducer; and
    a front protective structure formed on a surface of the acoustic matching layer opposite that of the piezoelectric element, the protective structure comprising:
      a first metal layer and a second metal layer; and
      a polymer layer arranged between the first metal layer and the second metal layer.

16. The ultrasonic transducer of claim 15, wherein the first and second metal layers comprise stainless steel.

17. The ultrasonic transducer of claim 16, wherein the polymer layer comprises polyimide.

18. The ultrasonic transducer of claim 17, wherein the center resonant frequency of the transducer is approximately 3.2-3.3 MHz, and wherein the thickness of each of the first and second metal layers is approximately one-seventeenth of a wavelength of the center resonant frequency.

19. The ultrasonic transducer of claim 18, wherein the thickness of the polymer layer is approximately one-twentieth of the wavelength of the center resonant frequency.

20. The ultrasonic transducer of claim 15, wherein the thickness of the acoustic matching layer is between one-quarter and two-fifths of the wavelength of the predetermined center resonant frequency.

* * * * *